(12) United States Patent
Irie (10) Patent No.: US 8,064,043 B2
(45) Date of Patent: Nov. 22, 2011

(54) SHUTTER BLADE APPARATUS, SHUTTER UNIT, IMAGE PICKUP APPARATUS, EXPOSURE APPARATUS, AND METHOD OF MANUFACTURING DEVICE

(75) Inventor: Naoki Irie, Omura (JP)

(73) Assignee: Canon Kabushiki Kaisha, Tokyo (JP)

( * ) Notice: Subject to any disclaimer, the term of this patent is extended or adjusted under 35 U.S.C. 154(b) by 489 days.

(21) Appl. No.: 11/947,561

(22) Filed: Nov. 29, 2007

(65) Prior Publication Data

US 2008/0129976 A1     Jun. 5, 2008

(30) Foreign Application Priority Data

Dec. 1, 2006 (JP) .................................. 2006-326373

(51) Int. Cl.
*G03B 27/72* (2006.01)
(52) U.S. Cl. ........................................................ 355/71
(58) Field of Classification Search .................. 355/53, 355/67–71; 396/463, 484–492
See application file for complete search history.

(56) References Cited

U.S. PATENT DOCUMENTS

| 4,669,841 A * | 6/1987 | Kaneko et al. ................ 352/216 |
| 4,975,722 A * | 12/1990 | Suzuki et al. ................. 396/456 |
| 5,970,268 A * | 10/1999 | Aoshima ....................... 396/469 |
| 6,407,873 B1 * | 6/2002 | Tuchman ....................... 359/894 |
| 6,835,009 B2 * | 12/2004 | Toyoda .......................... 396/484 |
| 7,178,999 B2 * | 2/2007 | Stiehler ......................... 396/497 |
| 2005/0151952 A1 * | 7/2005 | Wang et al. .................... 355/71 |

FOREIGN PATENT DOCUMENTS

JP          11-233423          8/1999

* cited by examiner

*Primary Examiner* — Hung Henry Nguyen
(74) *Attorney, Agent, or Firm* — Canon USA Inc IP Division (57) ABSTRACT

A shutter blade apparatus includes a shutter blade; a first pushing member including two first pushing portions configured to push a first surface of the shutter blade; and a second pushing member including a second pushing portion configured to push a second surface of the shutter blade, the second surface being opposite to the first surface. The second pushing portion is located between the two first pushing portions.

1 Claim, 9 Drawing Sheets

FIG. 6
WAFER PROCESSING

SHUTTER BLADE APPARATUS, SHUTTER UNIT, IMAGE PICKUP APPARATUS, EXPOSURE APPARATUS, AND METHOD OF MANUFACTURING DEVICE

BACKGROUND OF THE INVENTION

1. Field of the Invention

The present invention relates to a shutter blade apparatus including a shutter blade that blocks and unblocks an opening, a shutter unit, an image pickup apparatus, an exposure apparatus, and a method of manufacturing a device using the exposure apparatus.

2. Description of the Related Art

In general, reduction projection exposure apparatuses and the like have been used for manufacturing semiconductor devices and the like. The reduction projection exposure apparatuses reduce the size of patterns formed on originals, such as reticles, using reduction projection lenses and project the reduced patterns onto substrates such as wafers. The pattern of a reticle is transferred to several tens of positions on a wafer by alternately repeating step driving of an XY stage and exposure. Recently, in order to improve the productivity of the exposure apparatuses, efforts have been made to reduce the cycle time during exposure by increasing the opening and closing speed or the like of shutters disposed on paths of exposure light. Moreover, in order to reduce the time required for exposure, the sensitivity of a resist applied to wafers or the like has been rapidly improved.

According to the above-described known technology, a shutter blade constituting a shutter in a light-source optical system that generates an exposure light beam is inserted into a path of the exposure light beam so as to block the light beam. Thus, the size of the shutter blade needs to be larger than the cross-section of the exposure light beam. Moreover, when the shutter is closed, the shutter blade absorbs the heat of the exposure light beam, and can be deformed or melted. Accordingly, the surface of the shutter blade in general has a mirror-like finish so as to reflect the exposure light beam. In addition, when the exposure light beam reflected by the shutter blade travels back to the light source, thermal fluctuations can be generated in the light source. Therefore, the shutter blade in general is obliquely inserted into the path of the exposure light beam such that the light beam reflected by the shutter blade does not travel back to the light source. With this arrangement, the cross-section of the light beam blocked by the shutter blade becomes elliptical.

Therefore, the size of the shutter blade needs to be still larger than the cross-section of the light beam perpendicular to the light path when only one shutter blade is used for blocking the light beam. On the other hand, the opening and closing speed of the shutter needs to be increased in order to improve the throughput of the exposure apparatus. Accordingly, the weight of the shutter blade needs to be reduced while the required cross-section of the shutter blade is maintained. To this end, the thickness of the shutter blade may be reduced by using a light and heat-resistant metallic material for the shutter blade. Some known technologies intend to reduce the weight of the shutter blade while the cross-section required for blocking the exposure light beam is maintained. Japanese Patent Laid-Open No. 11-233423, for example, describes a shutter for exposure facilitating an increase in the opening and closing speed.

Figure 7A:
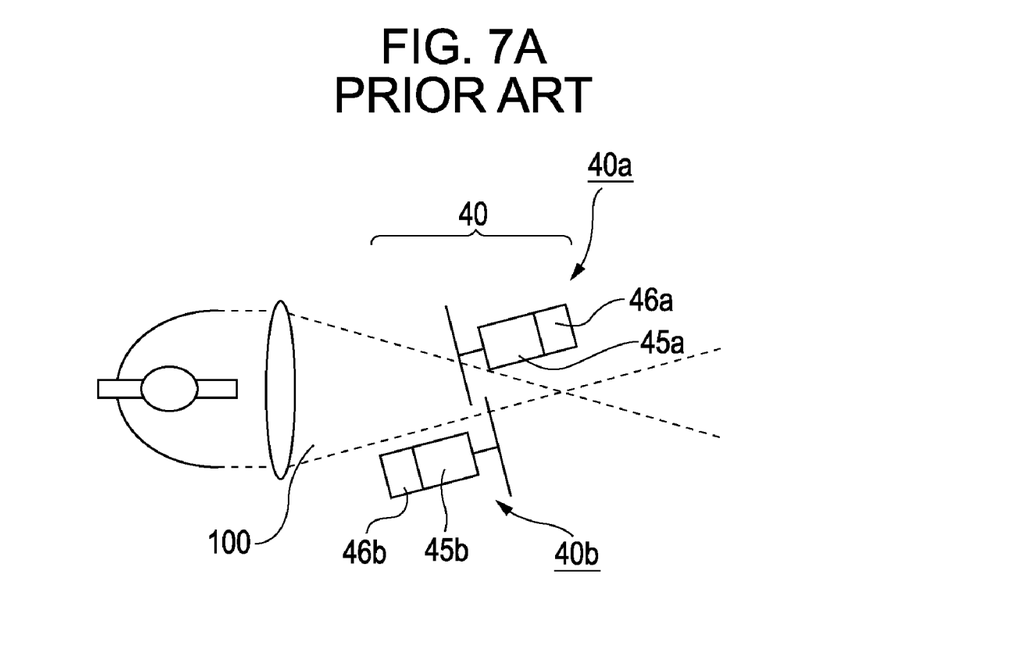
FIG. 7A is a schematic view of a known shutter for exposure.
Figure 7B:
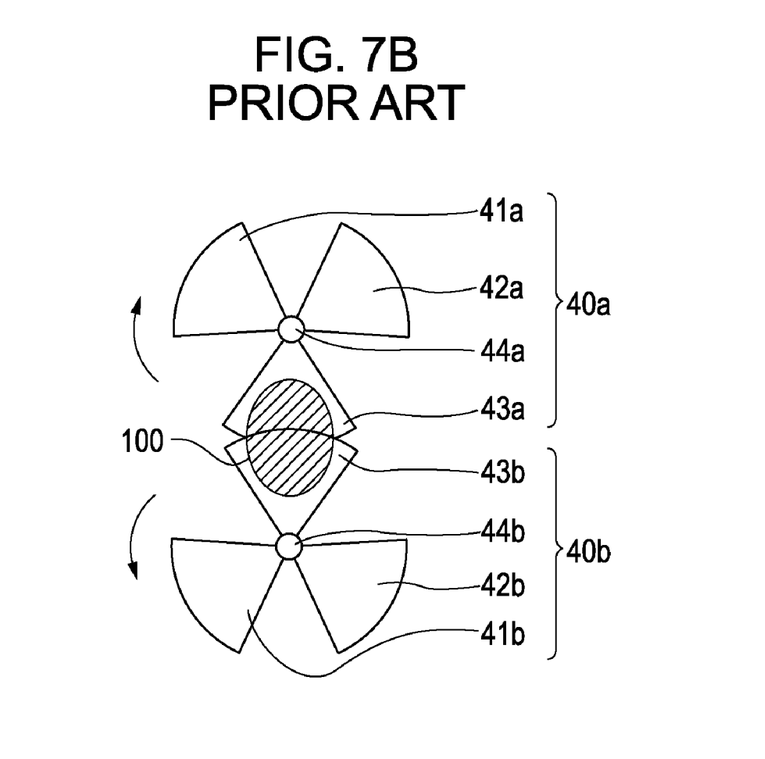
FIG. 7B is a front view of the known shutter viewed from a position adjacent to a light source.

The known technology will now be described with reference to FIGS. 7A and 7B. A shutter 40 formed of a pair of rotary shutter units 40a and 40b is disposed on a path of an exposure light beam 100 to which a wafer or the like is exposed. The rotary shutter units 40a and 40b are synchronously rotated by motors 45a and 45b, respectively. As shown in FIG. 7B, for example, the exposure light beam 100 is blocked or unblocked by the rotation of shutter blades 41a to 43a and shutter blades 41b to 43b of the rotary shutter units 40a and 40b, respectively. That is, the rotary shutter unit 40a partially blocks the upper half or more of the exposure light beam 100 in a successive manner using the three shutter blades 41a to 43a that are obliquely inserted into the path of the exposure light beam 100. Similarly, the rotary shutter unit 40b partially blocks the lower half or more of the exposure light beam 100 in a successive manner using the three shutter blades 41b to 43b that are obliquely inserted into the path of the exposure light beam 100.

The three shutter blades 41a to 43a and the three shutter blades 41b to 43b of the rotary shutter units 40a and 40b, respectively, form light-shielding portions each having a central angle of 60° disposed at intervals of 60° in a circumferential direction of rotating shafts 44a and 44b, respectively. The shutter blades 41a to 43a and the shutter blades 41b to 43b of the rotary shutter units 40a and 40b, respectively, are rotated in connection with the rotation of the rotating shafts 44a and 44b driven by the motors 45a and 45b, respectively. The rotating positions of the shutter blades are detected by rotary encoders 46a and 46b. In the above-described known technology, the size of the shutter blades can be reduced as compared with the case where only one shutter blade is used for blocking the entire exposure light beam 100. Accordingly, the moment of inertia of the shutter blades can be reduced, thereby facilitating an increase in the opening and closing speed of the shutter.

However, in the known technology described in Japanese Patent Laid-Open No. 11-233423, the rotary shutter units 40a and 40b need to be synchronously rotated using the motors 45a and 45b, and a difference in velocity of approximately sub-milliseconds is generated by factors such as mechanical structures. Furthermore, in order to equalize the distribution of the amount of exposure light applied in the exposure area of the wafer, both edges of the shutter blades 41a to 43a and the shutter blades 41b to 43b shown in FIG. 7B crossing the exposure light beam 100 need to have the same shape. Thus, the difference in velocity between the shutter blades 41a to 43a and the shutter blades 41b to 43b can exert detrimental effects on the distribution of the amount of exposure light in the above-described known technology.

On the other hand, only one shutter blade is used for blocking an exposure light beam while the thickness of the shutter blade is reduced such that the weight of the shutter blade is reduced in some technologies. However, the amount of light when the shutter is closed needs to be smaller than or equal to one-millionth of that when the shutter is fully opened. Therefore, in order to improve the blocking performance of the shutter, a shielding plate needs to be disposed in the vicinity of an opening that is to be blocked or unblocked by the shutter blade so as to be adjacent to the shutter blade. At this moment, when the stiffness of the shutter blade is reduced due to the low-profiled shutter blade, the shutter blade can be deformed by the weight thereof or a centrifugal force or the like during the rotation thereof, and can come into contact with the shielding plate. This can prevent normal operation of the shutter.

SUMMARY OF THE INVENTION

The present invention is directed to a shutter blade configured so as to be subjected to reduced deformation.

According to an aspect of the invention, a shutter blade apparatus includes a shutter blade, a first pushing member including two first pushing portions configured to push a first surface of the shutter blade, and a second pushing member including a second pushing portion configured to push a second surface of the shutter blade, the second surfaces being opposite the first surface. The second pushing portion is located between the two first pushing portions.

According to another aspect of the invention, a shutter unit includes the above-described shutter blade apparatus and a motor configured to rotate the shutter blade.

According to another aspect of the invention, an image pickup apparatus includes the above-described shutter blade apparatus and an image pickup element configured to receive light via the shutter blade apparatus.

According to another aspect of the invention, an exposure apparatus, exposing a substrate to light via a pattern formed on a retile, includes an illumination optical system configured to illuminate the reticle and the above-described shutter blade apparatus disposed in the illumination optical system.

According to another aspect of the invention, a method of manufacturing a device includes exposing a substrate to light using the above-described exposure apparatus, developing the exposed substrate, and producing the device by processing the developed substrate.

Further features and aspects of the present invention will become apparent from the following detailed description of exemplary embodiments with reference to the attached drawings. In the description, reference is made to accompanying drawings, which form apart thereof, and which illustrate an example of the invention. Such example, however, is not exhaustive of the various embodiments of the invention, and therefore reference is made to the claims which follow the description for determining the scope of the invention.

BRIEF DESCRIPTION OF THE DRAWINGS

The accompanying drawings, which are incorporated in and constitute a part of the specification, illustrate exemplary embodiments of the invention and, together with the description, serve to explain the principles of the invention.

DESCRIPTION OF THE EMBODIMENTS

Exemplary embodiments of the present invention will now be described with reference to the drawings.

First Exemplary Embodiment

Figure 1A:
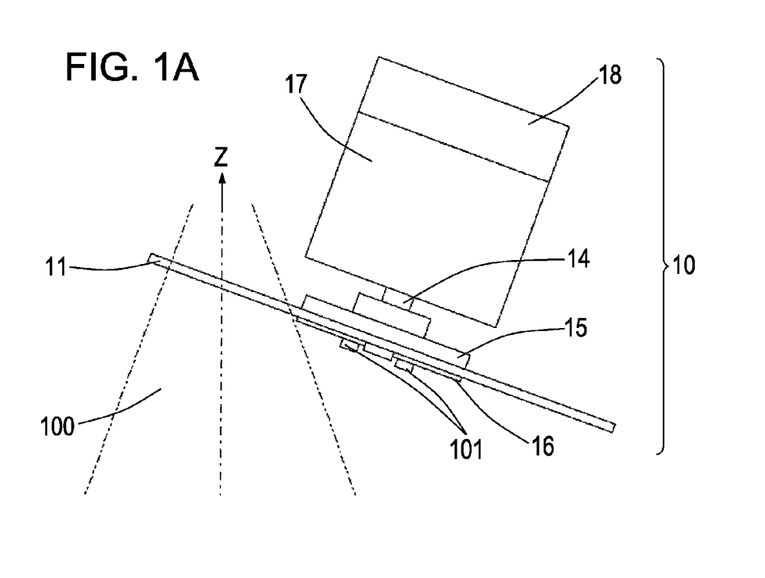
FIG. 1A is a side view of a shutter blade apparatus used in a shutter unit according to a first exemplary embodiment of the present invention.

As shown in FIG. 1A, a shutter unit 10 includes a shutter blade apparatus according to a first exemplary embodiment of the present invention. In FIG. 1A, a −Z direction corresponds to a direction of gravity. The shutter blade apparatus according to the first exemplary embodiment includes shutter blades 11, 12, and 13, a motor 17 having a rotary encoder 18, and a boss 15 and a retaining plate 16 that attach the shutter blades 11 to 13 to a rotating shaft 14 of the motor 17.

Figure 1B:
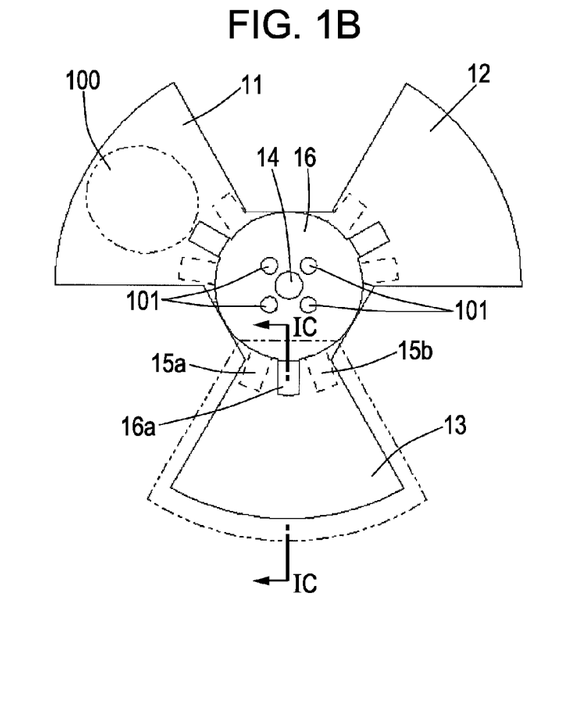
FIG. 1B is a front view of the shutter blade apparatus used in the shutter unit viewed from a position adjacent to a light source (in a Z direction).

As shown in FIG. 1B, the shutter blades 11, 12, and 13 each have a fan shape, and are radially disposed at regular intervals. The shutter blades 11, 12, and 13 are integrated with each other at a disk-shaped central portion having a predetermined area. The shutter blades 11, 12, and 13 are held between the boss 15 and the retaining plate 16 so as to be attached to the rotating shaft 14 of the motor 17 that has the rotary encoder 18 for detecting the rotational position of the rotating shaft 14. As shown in FIGS. 1A and 1B, the shutter blades 11, 12, and 13 are attached to the rotating shaft 14 by tightening bolts 101 that are screwed into both the boss 15 and the retaining plate 16 while the shutter blades 11, 12, and 13 are held between the boss 15 and the retaining plate 16.

The boss 15 includes a first pushing member having protrusions 15a and 15b serving as first supporting portions (first pushing portions) extending in three directions from the outer periphery of the boss 15, the first pushing member pushing first surfaces (i.e., surfaces facing the boss) of the shutter blades 11 to 13 at least two positions (see FIG. 1B). The retaining plate 16 includes a second pushing member having protrusions 16a serving as second supporting portions (second pushing portions) extending in three directions from the outer periphery of the retaining plate 16, the second pushing member pushing second surfaces (surfaces opposite the first surfaces; surfaces facing the retaining plate) of the shutter blades 11 to 13 at at least one position (see FIG. 1B). At least one of the protrusions 16a serving as the second supporting portions is located between the protrusions 15a and 15b serving as the first supporting portions (see FIG. 1D) so as to push and hold the shutter blades 11 to 13 between the protrusions 15a and 15b and the protrusion 16a. The first pushing member notionally indicates the boss 15, and the second pushing member notionally indicates the retaining plate 16.

As shown in FIG. 1A, the three shutter blades 11 to 13 are successively inserted into a light path 2 of an exposure light beam 100 so as to block the exposure light beam 100. That is, the three shutter blades 11, 12, and 13 of the shutter unit 10 form light-shielding portions having a central angle of 60° disposed at intervals of 60° in the circumferential direction of the rotating shaft 14 so as to block the exposure light beam 100. Space areas other than the light-shielding portions serving as substantial portions of the shutter blades 11 to 13 successively allow passage of the exposure light beam 100 without blocking the exposure light beam 100.

Figure 1C:
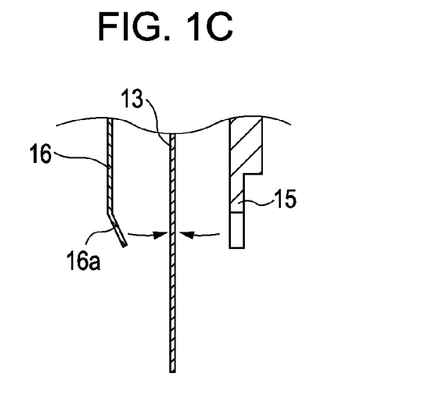
FIG. 1C is a schematic cross-sectional view taken along line IC-IC in FIG. 1B.

As shown in FIG. 1C, the protrusions 16a serving as the second supporting portions of the retaining plate 16 serving as the second pushing member are bent toward the second surfaces of the shutter blades 11 to 13 (toward the boss 15) in advance. The pushing force with which end portions of the protrusions 16a bent toward the boss 15 push the shutter blades 11, 12, and 13 is increased as the bolts 101 are more securely tightened. Since the pairs of protrusions 15a and 15b firmly support the pushing force of the end portions of the protrusions 16a, the holding force of the protrusions 15a and 15b and the protrusions 16a can be increased. Among the first supporting portions and the second supporting portions, the second supporting portions, for example, can be formed of plate springs bent toward the boss 15 instead of the protrusions 16a.

Figure 1D:
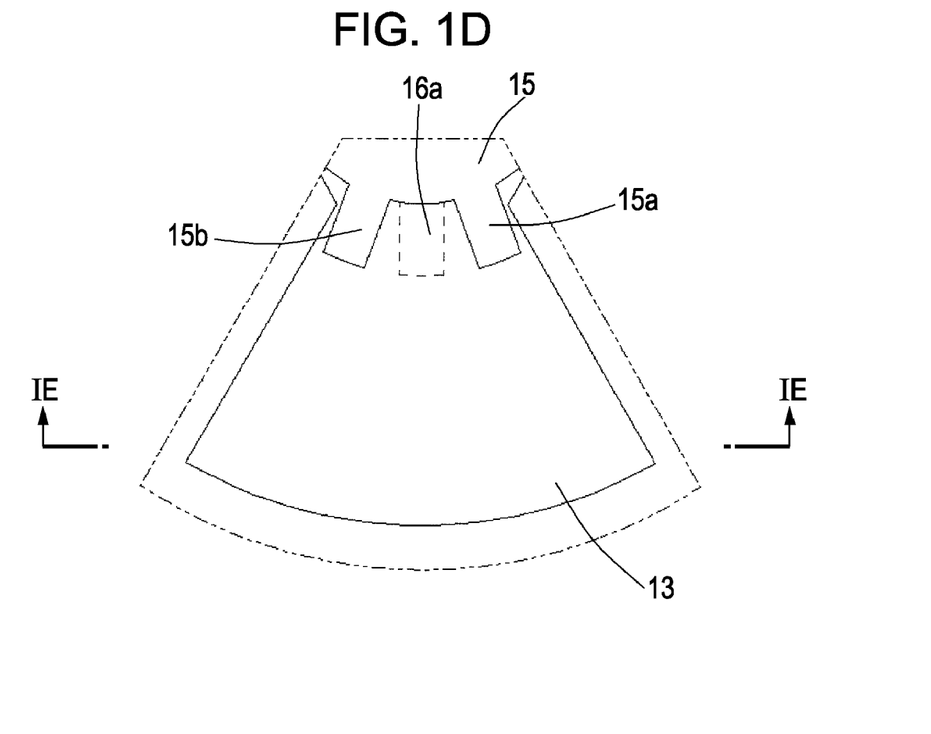
FIG. 1D is a rear view of a dotted portion shown in FIG. 1B.

Next, operations of the shutter blade apparatus according to the first exemplary embodiment of the present invention used in the shutter unit 10 will be described. After tightening the bolts 101 while the shutter blades 11, 12, and 13 are interposed between the boss 15 and the retaining plate 16, the shutter blades 11, 12, and 13 are attached to the rotating shaft 14 of the motor 17. In this exemplary embodiment, the protrusions 15a and 15b of the boss 15 and the protrusions 16a of the retaining plate 16 are arranged as shown in FIG. 1D. The protrusions 16a of the retaining plate 16 are located at substantially intermediate positions between the protrusions 15a and 15b of the boss 15 so as to support the shutter blades 11 to 13. Since the protrusions 16a of the retaining plate 16 are bent so as to have predetermined dimensions as shown in FIG. 1C, the shutter blades 11 to 13 are pressed and forcedly deformed.

Figure 1E:
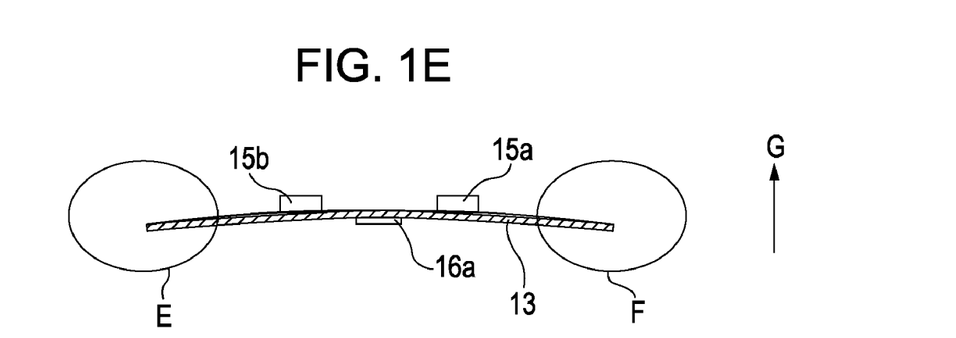
FIG. 1E is a schematic cross-sectional view taken along line IE-IE in FIG. 1D.

FIG. 1E illustrates the shutter blade 13 when the shutter blade 13 is forcedly deformed. Herein, the shutter blade 13 is described as an example. The shutter blade 13 is forcedly deformed around the protrusion 16a serving as a supporting point such that the end portions are lifted in a direction opposite to the direction in which the protrusions 15a and 15b protrude (−G direction). As shown in FIG. 1E, end portions E and F of the shutter blade 13 are separated from a horizontal line in a direction opposite that of the pushing force of the protrusion 16a as the positions of the end portions become closer to the ends (outer periphery) of the shutter blade 13. With this forced deformation, deformation of the shutter blade 13 caused by the weight thereof can be substantially cancelled, and the stiffness thereof can also be increased. Thus, deformation of the shutter blade 13 during the rotation thereof can be minimized.

The stiffness of the shutter blades 11, 12, and 13 can be increased by applying the structure according to the first exemplary embodiment also to the shutter blade 11 and 12. This leads to a reduction in thickness of the shutter blades 11, 12, and 13. In the first exemplary embodiment, only the protrusion 16a of the retaining plate 16 is bent in advance so as to have predetermined dimensions. However, the protrusions 15a and 15b of the boss 15 can also be bent toward the first surface of the shutter blade 13 so as to have predetermined dimensions. Herein, the bolts 101 have a function of adjusting the pushing forces with which the boss 15 and the retaining plate 16 push the first and second surfaces, respectively, of the shutter blades 11 to 13.

According to the first exemplary embodiment of the present invention, the amount of forced deformation of the E and F portions (see FIG. 1E) of the shutter blades 11 to 13 can be adjusted and controlled as appropriate by adjusting the tightening force of the bolts 101. Therefore, the deformation of the shutter blades 11 to 13 caused by the weights thereof and by a centrifugal force or the like generated during the operation of the shutter unit 10 can be minimized even when thin and low-stiffness shutter blades 11 to 13 are used for higher speed. From this point of view, the shutter blades 11 to 13 can be made thinner and lighter, and the moment of inertia of the shutter blades 11 to 13 can be further reduced. With this, faster and more highly functional shutters can be realized. On the other hand, according to the shutter unit 10 in accordance with the first exemplary embodiment of the present invention, the amounts of forced deformation, the shapes, and the strengths of the shutter blades 11 to 13 can be desirably controlled by adjusting the bolts 101 even when the shutter blades 11 to 13 are made thinner (lighter) and are easily deformed. With this, the deformation of the shutter blades caused by the weights thereof and the deformation of the shutter blades caused by a centrifugal force or the like generated during the operation of the shutter unit can be minimized, thereby ensuring stable blocking and unblocking of an exposure aperture at high speed.

Second Exemplary Embodiment

Figure 2A:
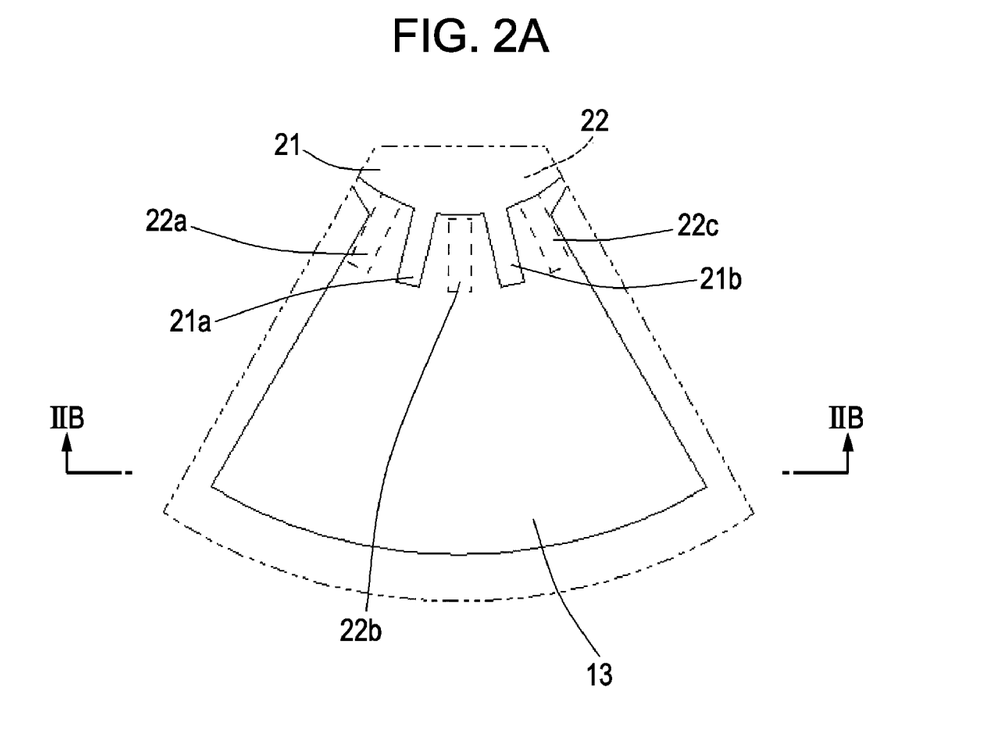
FIG. 2A is a rear view of a principal portion of a shutter blade apparatus used in a shutter unit according to a second exemplary embodiment of the present invention.
Figure 2B:
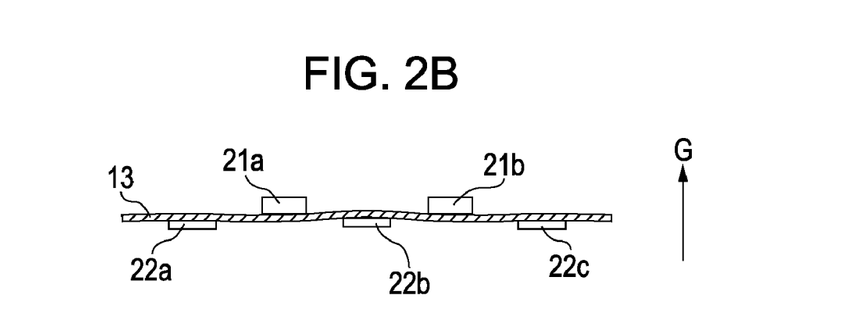
FIG. 2B is a schematic cross-sectional view taken along line IIB-IIB in FIG. 2A.

Next, a second exemplary embodiment of the present invention will be described. In FIGS. 2A and 2B, the same reference numbers and symbols are used for the same components shown in FIGS. 1A to 1E, and the descriptions thereof will be omitted or simplified. In this exemplary embodiment, five protrusions serving as first and second supporting portions (described below) are provided for each of the shutter blades (light-shielding portions) 11, 12, and 13 as shown in FIGS. 2A and 2B. Since the structures of the shutter blades 11, 12, and 13 are the same in this exemplary embodiment, only the structure of the shutter blade 13 will be described as an example. In the second exemplary embodiment, a first pushing member notionally indicates a boss 21, and a second pushing member notionally indicates a retaining plate 22.

A first surface of the shutter blade 13 is supported by two protrusions 21a and 21b serving as the first supporting portions, having a space therebetween, of the boss 21 that is attached to the rotating shaft 14. Moreover, a second surface of the shutter blade 13 is supported by three protrusions 22a, 22b, and 22c serving as the second supporting portions, disposed at regular intervals, of the retaining plate 22. That is, the protrusion 21a is located at an intermediate position of the protrusions 22a and 22b (see FIG. 2A) such that the shutter blade 13 is pressed and held by the protrusion 21a and the protrusions 22a and 22b. In addition, the protrusion 21b is located at an intermediate position of the protrusions 22b and 22c (see FIG. 2A) such that the shutter blade 13 is pressed and held between the protrusion 21b and the protrusions 22b and 22c.

In this manner, the shutter blade 13 is pressed and held by the five protrusions 21a, 21b, and 22a to 22c disposed at regular intervals such that the amount of forced deformation of the shutter blade 13 is maintained more stably by a more stable pushing force. Moreover, the protrusion 22b of the retaining plate 22 is bent toward the second surface of the shutter blade 13 in advance as compared with the protrusions 22a and 22c so as to have predetermined dimensions. With this, the pushing force of the protrusion 22b can be increased. All the five protrusions 21a, 21b, and 22a to 22c or the protrusion 22b of the retaining plate 22 bent toward the boss 21 can be formed of a plate spring as in the first exemplary embodiment.

Next, operations of a shutter blade apparatus according to the second exemplary embodiment of the present invention used in a shutter unit will be described. First, the retaining plate 22 is fixed to the boss 21 by tightening the bolts 101 while the shutter blades 11, 12, and 13 are interposed between the boss 21 and the retaining plate 22. Since the protrusion 22b of the retaining plate 22 is bent in advance so as to have predetermined dimensions, the shutter blade 13 is pushed by the protrusion 22b, and forcedly deformed as shown in FIG. 2B. However, the amount of forced deformation of the shutter blades 11, 12, and 13 at both ends adjacent to the outer peripheries thereof can be regulated due to the protrusions 22a and 22c of the retaining plate 22 (see FIG. 2B). In the first exemplary embodiment, the amount of deformation at the E and F portions shown in FIG. 1E is increased as the thickness of the shutter blades 11, 12, and 13 is reduced. However, the speed of the shutter unit cannot be increased when air resistance occurs during the rotation of the shutter blades 11, 12, and 13 due to the deformation of the shutter blades 11, 12, and 13.

Therefore, in the second exemplary embodiment, the amount of deformation of the shutter blades 11, 12, and 13 at the E and F portions shown in FIG. 1E is regulated by arranging the protrusions 22a and 22c of the retaining plate 22 in the vicinity of the E and F portions. In the second exemplary embodiment, only the protrusion 22b of the retaining plate 22 is bent in advance so as to have predetermined dimensions. However, the protrusions 21a and 21b of the boss 21 and the protrusions 22a and 22c of the retaining plate 22 can also be bent toward the first surface and the second surface, respectively, of the shutter blade 13 so as to have predetermined dimensions. Herein, the bolts 101 are used for adjusting the pushing forces with which the boss 21 and the retaining plate 22 push the first and second surfaces, respectively, of the shutter blades 11, 12, and 13.

According to the second exemplary embodiment of the present invention, the amount of forced deformation of the E and F portions (see FIG. 1E) of the shutter blades 11 to 13 can also be adjusted and controlled as appropriate by adjusting the tightening force of the bolts 101. Therefore, the deformation of the shutter blades 11 to 13 caused by the weights thereof and by a centrifugal force or the like generated during the operation of the shutter unit 10 can be minimized even when thin and low-stiffness shutter blades 11 to 13 are used for higher speed. From this point of view, the shutter blades 11 to 13 can be made thinner and lighter, and the moment of inertia of the shutter blades 11 to 13 can be further reduced. With this, faster and more highly functional shutter units can be realized. In the second exemplary embodiment, in particular, the shutter blade 13 is pressed and held by the five protrusions 21a and 21b, and 22a to 22c disposed at regular intervals such that the amount of forced deformation, the shape, and the strength of the shutter blade 13 are maintained more stably by a more stable pushing force. This can lead a more reliable shutter blade.

Third Exemplary Embodiment

Image Pickup Apparatus

Figure 3A:
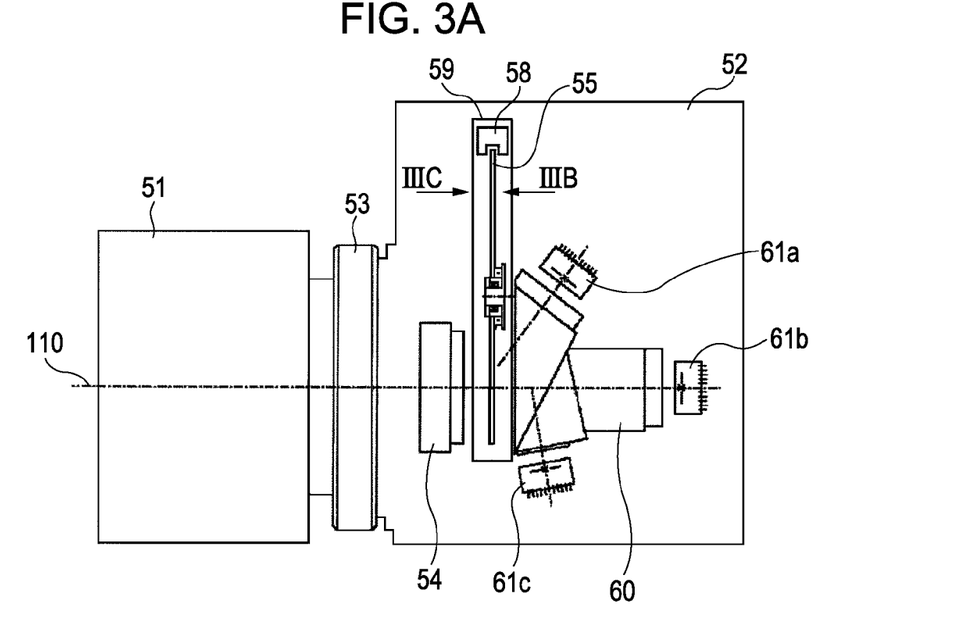
FIG. 3A is a side view of an image pickup apparatus such as a television camera including an imaging optical system to which a shutter unit (shutter blade apparatus) according to a third exemplary embodiment of the present invention is incorporated.

Next, a third exemplary embodiment of the present invention will be described.
Structure of Image Pickup Apparatus As shown in FIG. 3A, an image pickup apparatus in this exemplary embodiment includes an image taking lens 51 disposed along a light axis 110, a television camera 52 including a rotary shutter, a bayonet mount 53, and a filter 54 such as an optical low-pass filter and a near-infrared cut filter. Moreover, the image pickup apparatus includes an aperture plate 55 constituting a rotating body of the rotary shutter, a retaining plate 56 the holds the aperture plate 55, and a supporting member 57 that supports the aperture plate 55. Furthermore, the image pickup apparatus includes a photosensor 58 of the transmissive type and a rotary shutter unit 59. In addition, the image pickup apparatus includes a color-separation prism 60 that supports a three-CCD system and image pickup elements 61a, 61b, and 61c.

The rotary shutter unit 59 is formed of the aperture plate 55, the retaining plate 56, the supporting member 57, and the photosensor 58. The rotary shutter unit 59 is disposed such that the opening 55a can be located between the image taking lens 51 and the color-separation prism 60 when the rotary shutter unit 59 is positioned at a predetermined rotational angle. A light beam output from the image taking lens 51 passes through an opening 55a of the aperture plate 55, and is received by at least one of the image pickup elements 61a, 61b, and 61c via the color-separation prism 60. When an image pickup system of the television camera 52 is used for capturing images of a fast moving object, the rotary shutter unit 59 can supply intermittent instantaneous exposures to the image pickup element 61b and the like such that excellent images with reduced blur and distortion can be obtained.

Figure 3B:
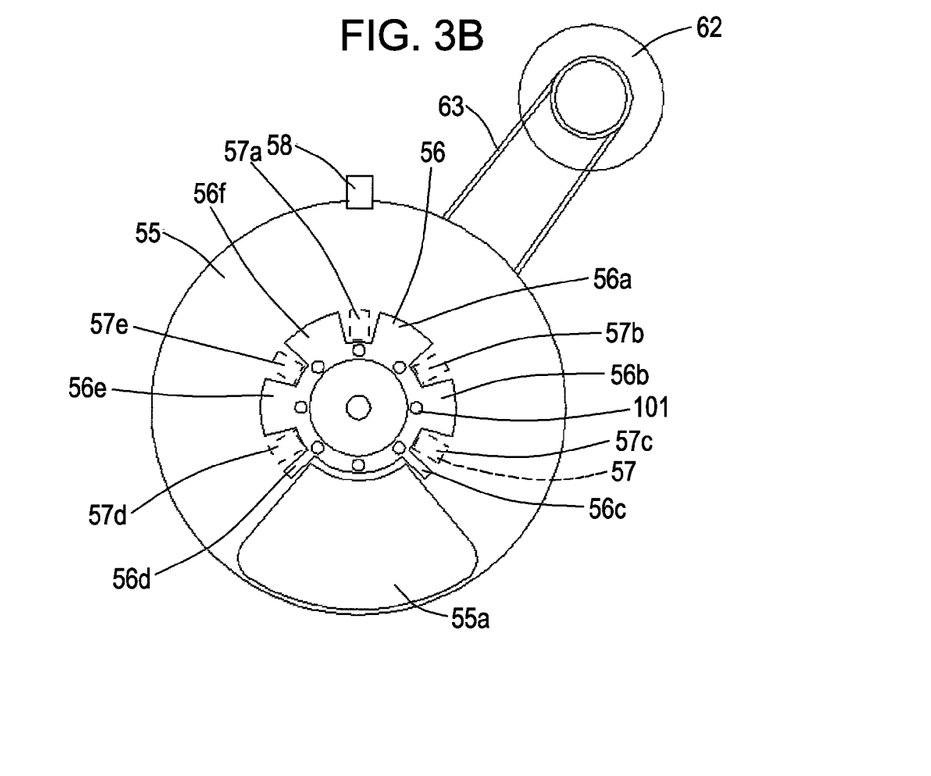
FIG. 3B is a schematic view of the shutter unit (shutter blade apparatus) viewed in the direction of an arrow IIIB shown in FIG. 3A.
Figure 3C:
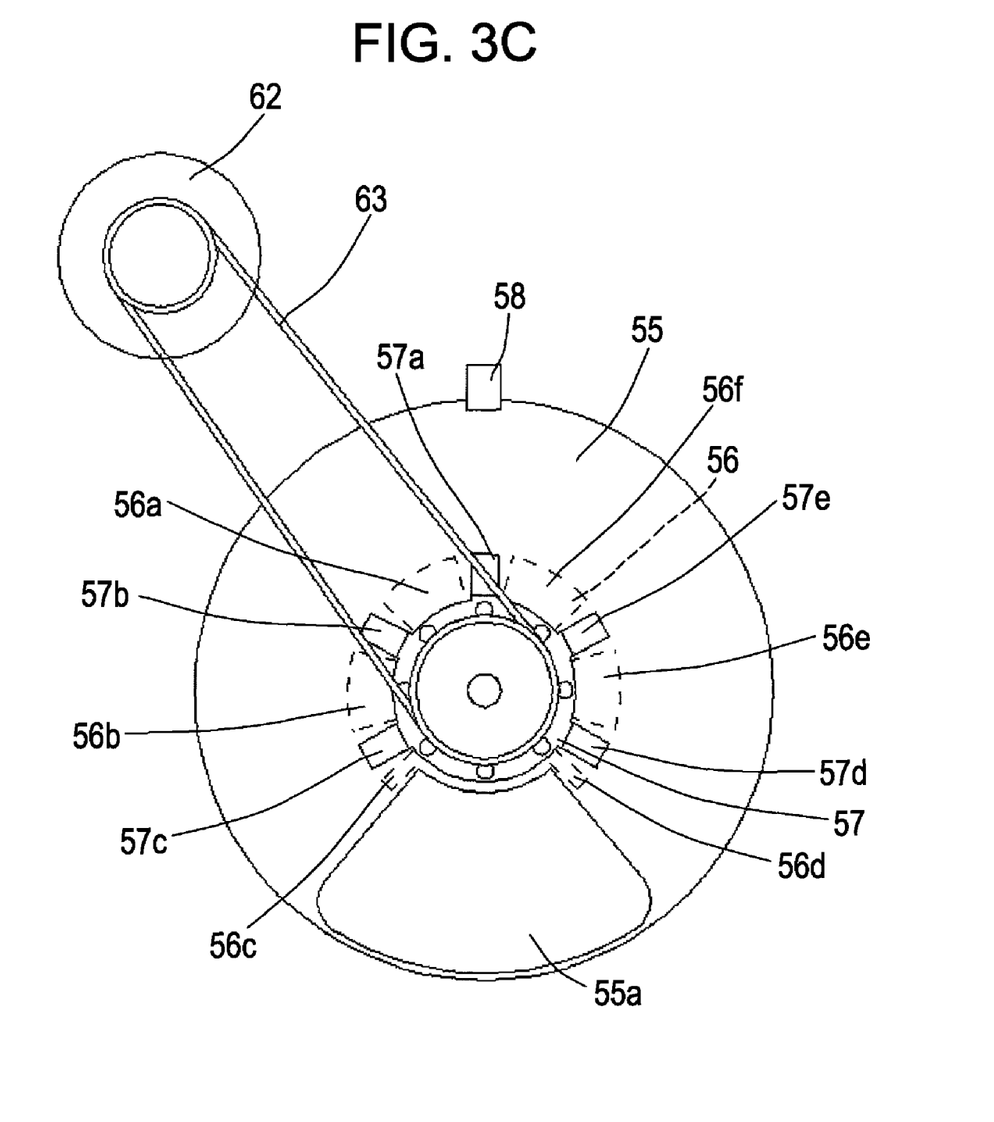
FIG. 3C is a schematic view of the shutter unit (shutter blade apparatus) viewed in the direction of an arrow IIIC shown in FIG. 3A.

The mass distribution of the aperture plate 55 may be uneven due to the opening 55a, and the aperture plate 55 may wobble due to a centrifugal force during, in particular, high-speed rotation. This may exert detrimental effects on image pickup performance. In order to eliminate such concerns, protrusions 57a to 57e serving as first supporting portions of the supporting member 57 serving as a first pushing member are pressed toward a first surface of the aperture plate 55 as shown in FIGS. 3B and 3C in the third exemplary embodiment. Moreover, protrusions 56a to 56f serving as second supporting portions of the retaining plate 56 serving as a second pushing member are pressed toward a second surface of the aperture plate 55. The supporting member 57 and the retaining plate 56 hold the aperture plate 55 therebetween by tightening the bolts 101.

That is, the protrusions 57a to 57e and the protrusions 56a to 56f are disposed in an alternating manner on either surface of the aperture plate 55, and the aperture plate 55 is held by the protrusions by tightening the bolts 101. At least end portions of the protrusions 57a to 57e of the supporting member 57 are bent toward the first surface of the aperture plate 55 in advance so as to forcedly deform the aperture plate 55. Since the stiffness of the aperture plate 55 can be increased by the deformation, the deformation of the aperture plate 55 caused by a centrifugal force or the like generated during the rotation thereof can be minimized, and the wobbling of the aperture plate 55 during the rotation thereof can be reduced. Herein, the supporting member 57 and the retaining plate 56 can be, for example, disk-shaped members, and have the first and second supporting portions (protrusions), respectively, at the peripheries thereof. On the other hand, the protrusions 57a to 57e and the protrusions 56a to 56f can be plate springs as appropriate.

In the rotary shutter unit 59, the aperture plate 55 is rotated by energizing a motor 62 connected to a rotating body integrated with the aperture plate 55 via a belt 63. Since the rotation of the aperture plate 55 needs to be synchronized with read signals of the image pickup element 61a and the like, the number of revolutions of the aperture plate 55 is detected by the photosensor 58. The photosensor 58 can be, for example, of the encoder type that reads light transmitting through a slit (not shown) of the aperture plate 55. Herein, the bolts 101 have a function of adjusting the pushing forces with which the supporting member 57 and the retaining plate 56 push the first and second surfaces, respectively, of the aperture plate 55.

In the image pickup apparatus according to the third exemplary embodiment of the present invention, the first supporting portions (protrusions 57a to 57e) and the second supporting portions (protrusions 56a to 56f) are pressed toward the aperture plate 55. Thus, effects similar to those in the first exemplary embodiment can be produced. That is, even when the aperture plate 55 is made thinner (lighter) and is easily deformed, the amount of forced deformation and the shape of the aperture plate 55 can be desirably controlled such that the aperture plate 55 is not easily deformed. With this, the deformation by the weight and that caused by a centrifugal force or the like can be minimized in the image pickup apparatus according to the third exemplary embodiment. Thus, the exposure aperture (opening 55a) of the aperture plate 55 can be stably blocked and unblocked at high speed. Therefore, the image pickup apparatus according to the third exemplary embodiment can produce excellent images with reduced blur and distortion due to improvements in rotational balance of the aperture plate 55 achieved by reducing the wobbling of the aperture plate 55 during the high-speed rotation thereof.

Fourth Exemplary Embodiment

Exposure Apparatus

Figure 4:
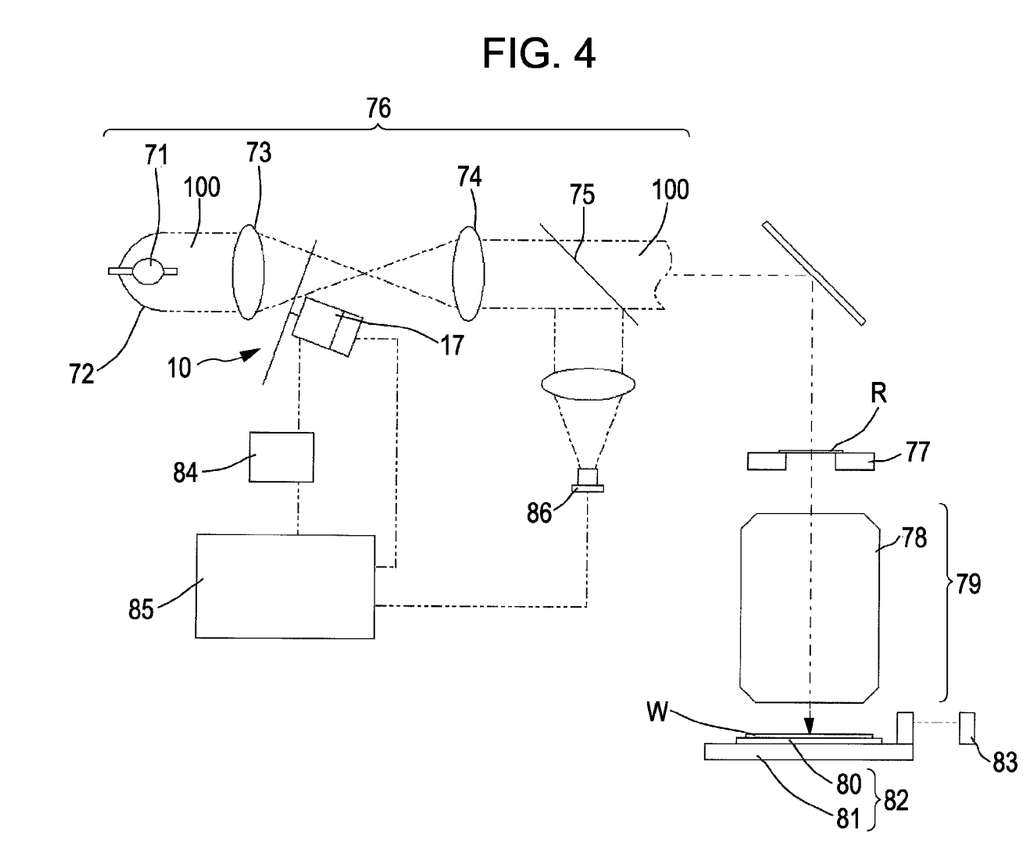
FIG. 4 is a schematic view of an exposure apparatus to which a shutter unit (shutter blade apparatus) according to a fourth exemplary embodiment of the present invention is incorporated.

Next, a fourth exemplary embodiment of the present invention will be described. In FIG. 4, the same reference numbers and symbols are used for the same components shown in FIGS. 1A to 1E, and the descriptions thereof will be omitted or simplified. As shown in FIG. 4, an exposure apparatus according to this exemplary embodiment includes a mercury lamp 71 serving as a light source, an elliptic mirror 72 that condenses an exposure light beam 100 emitted from the mercury lamp 71, and a first lens 73 that converges the exposure light beam 100. Moreover, the exposure apparatus includes a light-source optical system 76 including the shutter unit 10 used for exposure, a second lens 74 that collimates the light beam converged by the first lens 73, and a half mirror 75 for extracting part of the exposure light beam 100. Furthermore, the exposure apparatus includes a reticle stage 77 on which a reticle R is placed. The reticle R serves as an original having a pattern, the pattern being transferred onto a wafer W serving as an object to be exposed (substrate) during each shot.

In addition, the exposure apparatus according to this exemplary embodiment shown in FIG. 4 includes a projection optical system 79 including a reduction projection lens 78 for projecting the reduced pattern of the reticle R onto the wafer W. Furthermore, the exposure apparatus includes a wafer stage 82 serving as a retaining unit including a θz tilt stage 80 on which the wafer W is placed, the θz tilt stage 80 moving the wafer W in a light-axis direction, and an XY stage 81 that moves the wafer W in X and Y directions. The position of the XY stage 81 is measured by a laser interferometer 83. The rotation of the motor 17 of the shutter unit 10 is controlled by a controller 85 serving as a control unit via a motor driver 84. The controller 85 controls the aperture time of the shutter unit 10 such that the wafer W is exposed to a predetermined amount of light on the basis of the output from a photodetector 86 that detects the part of the exposure light beam 100 extracted using the half mirror 75.

On the other hand, the pattern area of the reticle R is exposed to a predetermined amount of light. The pattern is reduced in size to a predetermined magnification (for example, ¼ or ⅕) by the projection optical system 79, and transferred onto the wafer W retained by the wafer stage 82. This exposure operation is repeated on a plurality of transfer areas (shot areas) on the wafer W. Since the scan-exposure operation is repeated on the plurality of transfer areas, the application of at least one of the structures shown in the first to third exemplary embodiments to the structure for retaining the shutter blades 11 to 13 can increase the opening and closing speed of the shutter unit 10. When the structure including the shutter unit 10 according to any one of the first to third exemplary embodiments is applied to the exposure apparatus, the exposure apparatus can maintain stabilized exposure accuracy, and can reduce the cycle time so as to improve the throughput of the exposure apparatus.

The exposure apparatus according to this exemplary embodiment can be applied to, for example, those of the step-and-scan type or of the stepper type. In an exposure apparatus of the stepper type, a wafer is moved to the next exposure position in a stepped manner by a wafer stage each time one-shot exposure is conducted. In the exposure apparatus according to this exemplary embodiment, g line having a wavelength of 436 nm, i line having a wavelength of 365 nm, or the like can be used as a light source. However, the present invention is not limited to these, and KrF excimer lasers, ArF excimer lasers, $F_2$ excimer lasers, or the like can also be used. Moreover, the projection optical system 79 is not limited to the dioptric optical system, and can be a catadioptric optical system in which reflective elements are partly used.

Method of Manufacturing Device

Figure 5:
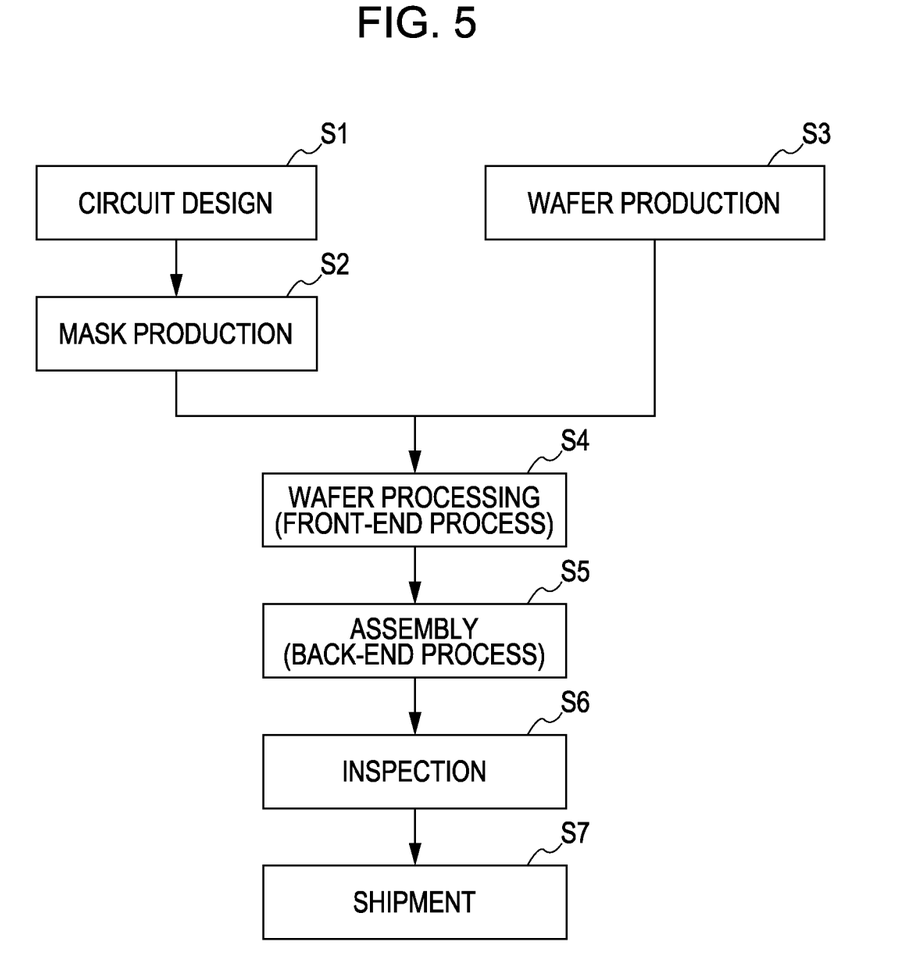
FIG. 5 is a flow chart illustrating a method of manufacturing a device using the exposure apparatus according to the fourth exemplary embodiment of the present invention.

Next, a method of manufacturing a device using the above-described exposure apparatus according to the fourth exemplary embodiment of the present invention will be described with reference to FIGS. 5 and 6. FIG. 5 is a flow chart of manufacturing devices, for example, semiconductor chips such as ICs and LSI circuits, LCDs, or CCD sensors. Herein, a method of manufacturing semiconductor devices will be described as an example. In Step S1 (circuit design), circuits of semiconductor devices are designed. In Step S2 (mask production), masks (also referred to as originals or reticles) are produced on the basis of the designed circuit patterns. In Step S2, reticles can be produced. In Step S3 (wafer production), wafers (also referred to as substrates) are produced using materials such as silicon.

Step S4 (wafer processing) is referred to as a front-end process in which real circuits are formed on the wafers by the above-described exposure apparatus with lithography technology using the masks or the reticles and the wafers. Step S5 (assembly) is referred to as a back-end process in which semiconductor devices are produced using the wafers processed in Step S4. Step S5 includes an assembly step (dicing and bonding), a packaging step (molding), and the like. In Step S6 (inspection), operations, durability, and the like of the semiconductor devices produced in Step S5 are checked. The semiconductor devices produced through these steps are then shipped (Step S7).

Figure 6:
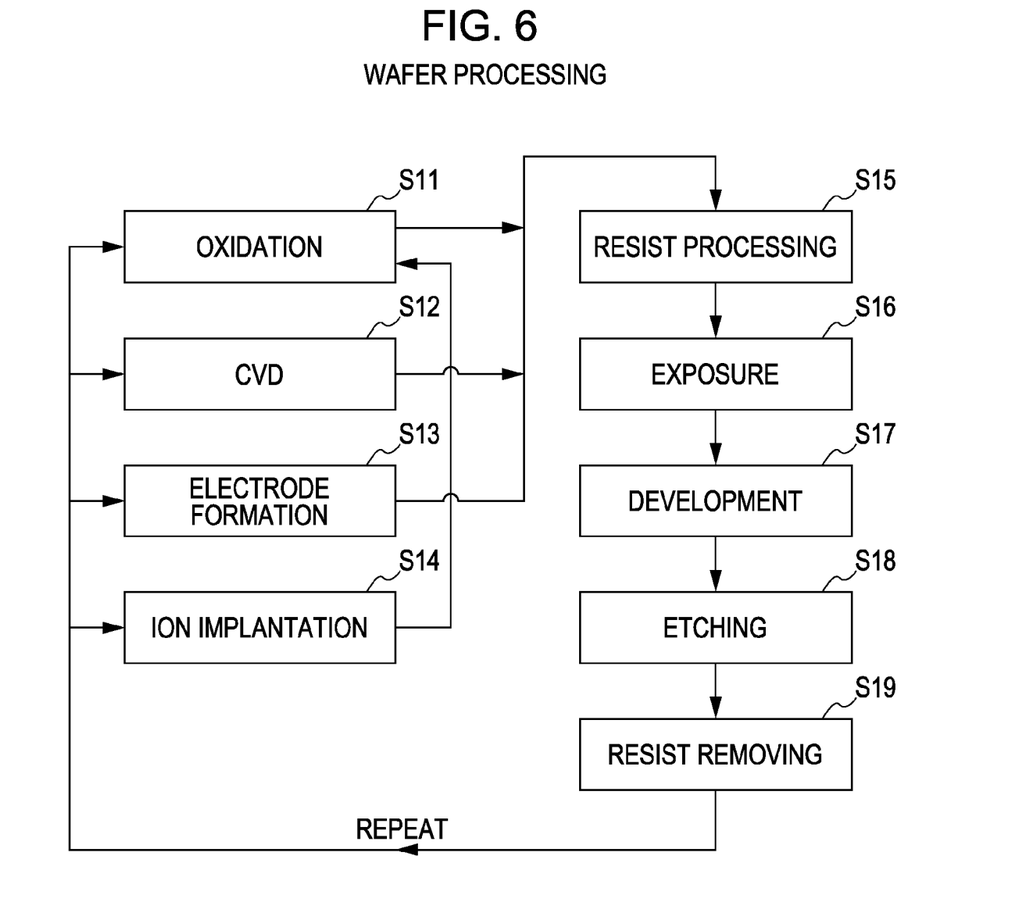
FIG. 6 is a detailed flow chart illustrating wafer processing in Step S4 in the flow chart shown in FIG. 5.

FIG. 6 is a flow chart illustrating the wafer processing in Step S4 in detail. In Step S11 (oxidation), the surfaces of the wafers are oxidized. In Step S12 (chemical vapor deposition; CVD), insulating films are deposited on the surfaces of the wafers. In Step S13 (electrode formation), electrodes are formed on the wafers. In Step S14 (ion implantation), ions are implanted in the wafers. In Step S15 (resist processing), photosensitizer is applied to the wafers. In Step S16 (exposure), the wafers are exposed to light passing through the masks or the reticles having the circuit patterns using the above-described exposure apparatus. In Step S17 (development), the exposed wafers are developed.

In Step S18 (etching), portions other than those of the developed resist images are removed. In Step S19 (resist removing), the resist that is no longer required after etching is removed. Repetition of these steps can form multiplex circuit patterns on the wafers. In the method of manufacturing a device according to the exemplary embodiment, exposure can be stably conducted at high speed due to the use of the above-described exposure apparatus. Thus, more reliable devices can be manufactured more stably at higher speed.

According to the above-described exemplary embodiments, for example, the deformation of the shutter blades can be reduced.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the priority of Japanese Application No. 2006-326373 entitled "shutter blade apparatus, shutter unit, image pickup apparatus, exposure apparatus, and method of manufacturing device" filed Dec. 1, 2006, which is hereby incorporated by reference herein in its entirety.

What is claimed is:

1. A shutter blade apparatus comprising:
a shutter blade;
a motor configured to rotate the shutter blade;
a first pushing member including two first pushing portions configured to push a first surface of the shutter blade;
a second pushing member including a second pushing portion configured to push a second surface of the shutter blade, the second surface being opposite to the first surface;
a fixing portion configured to fix the shutter blade to a rotation axis of the motor,
wherein the first pushing member and the second pushing member apply a force in an opposing direction to a different portion of the shutter blade, and the shutter blade is forcibly deformed by the force,
wherein the fixing portion comprises:
first and second pressing plates configured to fix the shutter blade to the rotation axis of the motor; and
a bolt configured to fix the first pressing plate disposed on the side of the first surface of the shutter blade to the second pressing plate disposed on the side of the second surface of the shutter blade, with the shutter blade interposed between the first and the second pressing plates,
wherein the first pushing portion is fixed to the first pressing plate, and the second pushing portion is fixed to the second pressing plate.

* * * * *